United States Patent [19]

Yamada et al.

[11] Patent Number: 4,636,966

[45] Date of Patent: Jan. 13, 1987

[54] METHOD OF ARRANGING LOGIC CIRCUIT DEVICES ON LOGIC CIRCUIT BOARD

[75] Inventors: Norio Yamada; Hayashi Kajitani; Kyoji Chiba; Mitsugu Edagawa, all of Hadano, Japan

[73] Assignee: Hitachi, Ltd., Tokyo, Japan

[21] Appl. No.: 578,211

[22] Filed: Feb. 8, 1984

[30] Foreign Application Priority Data

Feb. 22, 1983 [JP] Japan ................................. 58-28376

[51] Int. Cl.$^4$ ............................................. G06F 15/46
[52] U.S. Cl. ..................................... 364/491; 364/300
[58] Field of Search ........................ 364/491, 488–490, 364/300

[56] References Cited

U.S. PATENT DOCUMENTS

| | | | |
|---|---|---|---|
| 3,654,615 | 4/1972 | Freitag | 364/491 |
| 3,681,782 | 8/1972 | Scanlon | 364/491 |
| 4,263,651 | 4/1981 | Donath et al. | 364/491 X |
| 4,377,849 | 3/1983 | Finger et al. | 364/491 |
| 4,495,559 | 1/1985 | Gelatt, Jr. et al. | 364/491 X |

*Primary Examiner*—Edward J. Wise
*Attorney, Agent, or Firm*—Antonelli, Terry & Wands

[57] ABSTRACT

In the fabrication of an electronic circuit such as an integrated circuit, a method of determining the arrangement of logic circuit devices on a circuit board on the basis of a logic data defining the logic circuit devices and the interconnections among them. The logic circuit devices are classified in groups in accordance with a degree that each signal line connected with the logic circuit devices requires the expedition of signal propagation therethrough. First, the logic circuit devices belonging to the group pertinent to the highest degree are arranged, and next those belonging to the group pertinent to the second highest degree are arranged. Such a processing is carried out for all the groups.

4 Claims, 6 Drawing Figures

METHOD OF ARRANGING LOGIC CIRCUIT DEVICES ON LOGIC CIRCUIT BOARD

BACKGROUND OF THE INVENTION

This invention relates to a method of arranging devices on a logic circuit board and more particularly to a method of arranging devices which is suitable to arrange the devices, considering signal propagation delay time in a high-speed electronic logic circuit.

In the fabrication of an electronic circuit such as an integrated circuit, first, a logic data defining logic circuit devices and the interconnections among them is made, and thereafter on the basis of the logic data, these logic circuit devices are arranged on a logic circuit board and the wiring of signal lines connecting these circuit devices is made.

In determining the arrangement of logic circuit devices, it has been the conventional practice that the circuit devices are arranged with the total length of wiring made as short as possible in order to make the area required to arrange necessary circuit devices on a circuit board as small as possible, i.e., to reduce the chip size of an integrated circuit. However, in such a conventional method of arranging the circuit devices the signal propagation delay time among the circuit devices is not considered in the stage of arranging them, which entails such a disadvantage as to require subsequent manual change of the arrangement of the devices.

SUMMARY OF THE INVENTION

Accordingly, it is an object of the present invention to overcome the above defect of the conventional method and to provide a method of arranging devices which permits an optimum signal propagation delay time among the devices in arranging the devices on a circuit board.

According to an aspect of the present invention, there is provided a new method of arranging the devices on a circuit board. At first, the degree of expediting the signal propagation is allotted for each signal line connecting logic circuit devices. Next, all the circuit devices are classified in groups according to the above degree of the signal line connected thereto. First, the group of the devices pertinent to the highest degree are arranged so as to reduce the total length of the wiring thereof. Secondly, the group of the devices pertinent to the second highest extent are arranged in similar manner. The same processing is made for all the groups.

The present invention, together with further objects and advantages thereof, may best be understood by making reference to the following description, taken in conjunction with the accompanying drawings, in which like reference characters refer to like elements in the several views.

DESCRIPTION OF PREFERRED EMBODIMENTS

In the fabrication of the electronic component such as an LSI and printed circuit board, a logic data defining logic circuit devices such as an AND gate, OR gate, flip-flop, etc. and the interconnections among them is stored in an external memory such as a magnetic disk device, and on the basis of the data, the arrangement of the logic circuit devices on a circuit board is determined. In this case, it is necessary to consider the signal propagating delay time which is attributable to the floating capacitance, inductance and resistance existing in the signal lines connecting the circuit devices.

The lengthened signal line commonly increases the floating capacitance, inductance and resistance of the line, which requires the voltage of the signal propagated through the signal line to take a long time to reach a certain voltage level. Thus, the longer signal line causes the greater signal propagation delay time. Therefore, the length of the signal line in which signal propagation must be expedited must be shortened in order to decrease the floating capacitance, inductance and resistance thereof for the purpose of preventing the malfunction due to the signal delay.

This means that the length of the signal line in the logic circuit must be adjusted according to the degree that the signal propagation should be expedited, and hence it is determined by the positions of the devices connected with the pertinent signal line on the logic circuit board.

Generally, a short signal line suffices for connecting the devices which are near to each other while a long signal line is required to connect those devices which are far from each other. Therefore, it is necessary to arrange the devices connected with the signal line, in which signal propagation must be expedited, in proximity to each other as well as to arrange the devices connected with the signal line, in which signal propagation may not be expedited, at a long distance from each other.

The signal, for which the arrangement of the devices in which the signal propagation delay time is considered is required, includes a clock signal and error checking signal which are provided to control the operation of the logic circuit. On the other hand, the signal for which it is not required to consider the signal propagation delay time includes a signal in a scanning circuit which is installed for the diagnosis of the logic circuit.

Figure 1:
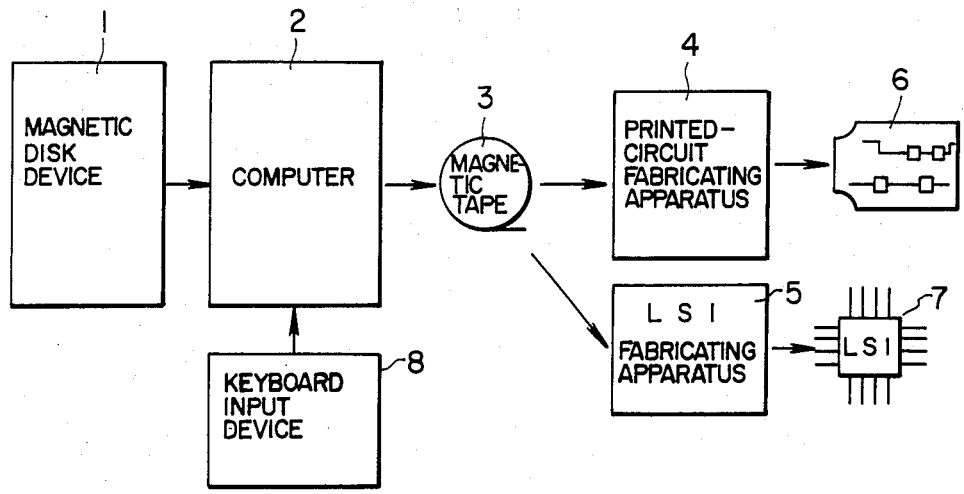
FIG. 1 is a block diagram showing an embodiment of the present invention.

FIG. 1 shows one embodiment of the present invention, which is a block diagram of an automatic designing and fabricating system of electronic components. In the figure, numeral 1 designates a magnetic disk device for storing the above-mentioned logic data; a computer 2 carries out the processing for the arrangement of logic circuit devices on the basis of the logic data and the data from a keyboard input apparatus 8, in accordance with a predetermined program; and the result of processing is stored in a magnetic tape device 3. A printed-circuit-board fabricating apparatus 4 and LSI fabricating apparatus 5 automatically fabricate printed circuit boards and LSI's on the basis of the data from the magnetic tape device 3, respectively.

Figure 2:
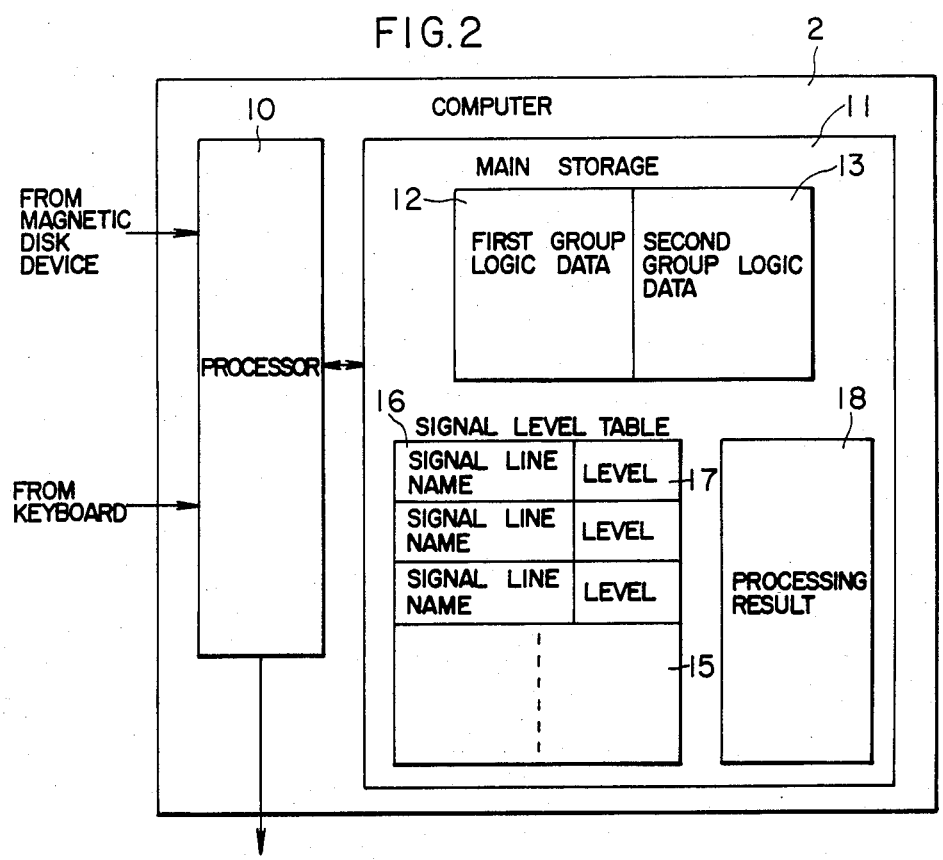
FIG. 2 is a detail view of a computer.
Figure 3:
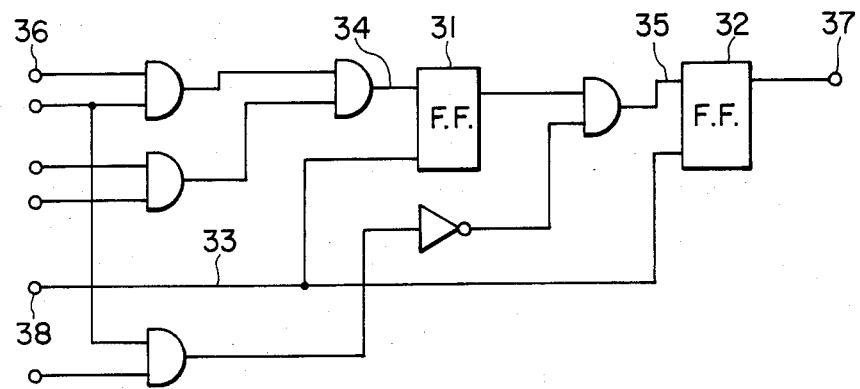
FIG. 3 is a block diagram of an embodiment of the logic circuit fabricated in accordance with the present invention.
Figure 4:
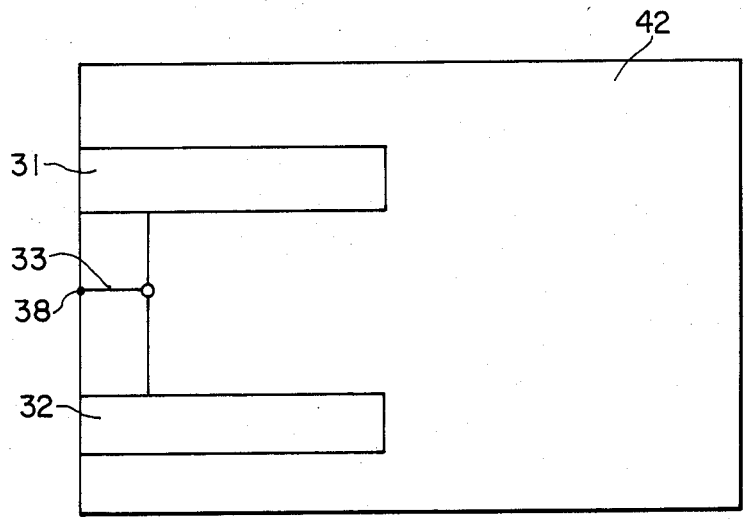
FIG. 4 is a view showing an example of an intermediate result of the arrangement of logic circuit devices in accordance with the present invention.
Figure 5:
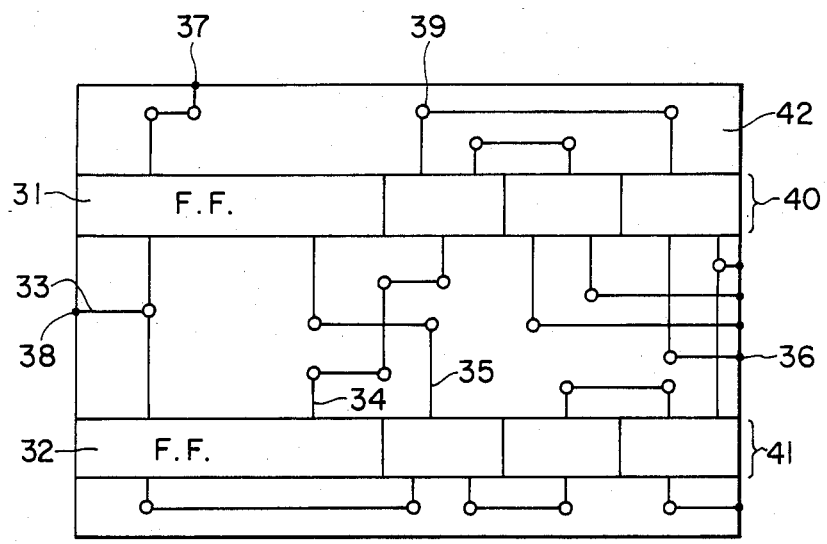
FIG. 5 is a view showing an example of the arrangement of logic circuit devices in accordance with the present invention.
Figure 6:
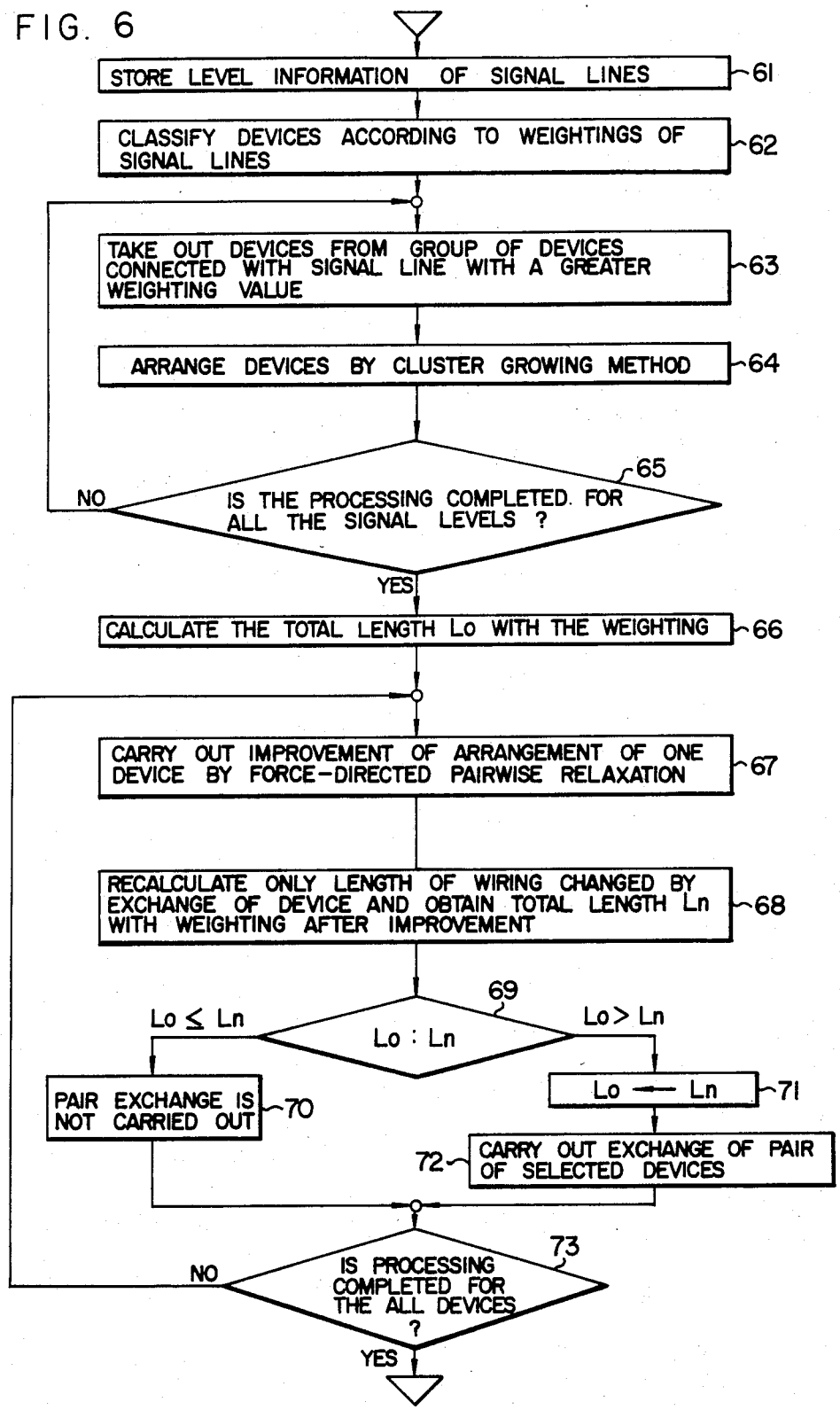
FIG. 6 is a flow chart showing the processing by a processor 10.

FIG. 2 shows the detail of the computer 2. FIGS. 3, 4 and 5 show a logic circuit to be fabricated and examples of the arrangements thereof, respectively. FIG. 6 shows a flow chart of the automatic arrangement processing by a processor 10. Detailed explanation will be made on one embodiment of the present invention referring to these figures.

FIG. 3 shows a logic circuit fabricated in this embodiment. In the figure, numerals 31 and 32 designate flip-flop devices, respectively which make storage operation of the logic values of signal lines 34 and 35, using the rising edge of the clock pulse supplied from a clock terminal 38 through a signal line 33; 36 an input pin for the logic circuit; and 37 an output pin.

The logic circuit of FIG. 3 performs the logic operation that when the clock pulse is applied to the signal line 33, the logic value of the flip-flop device 31 is taken into the flip-flop device 32 through an AND gate before the logic value of the flip-flop device 31 changes. In this case, the signal line requiring the highest degree of expediting the signal propagation is the signal line 33 among the signal lines of this logic circuit. The long signal propagation delay time in this signal line 33 may cause the device 32 to take in the logic value of the signal line 35 while the condition of the flop-flop device 31 is changing or after it has been changed, thereby imposing an unexpected operation on a designer of the logic circuit.

The logic data representing this logic circuit is stored in the magnetic disk device 1. The information (level information) showing the name of the signal line and the level thereof is inputted from the keyboard 8. This level information represents the weighting to 1 cm of the signal line. The signal level in this embodiment includes two levels consisting of level 1 and level 2. The number of levels can be selected as occasion demands. The level 1 carries such a weighting information as 48 per 1 cm while the level 2 carries such a weighting information as 1 per 1 cm. The ratio of 48 to 1 is determined by the sum of lattice dots in X and Y directions on the circuit board. One lattice means a minimum unit for determining the arrangement of the logic circuit devices. This allotment of weighting serves to prevent the signal line requiring an expedited signal propagation from being lengthened in an adjustment processing at step 66 et seq. of FIG. 6 which will be later described. The level 1 is supplied to the signal lines in which signal propagation must be expedited while the level 2 is supplied to the remaining signal lines.

In FIG. 3, the level 1 is applied to the signal line 33 which is a clock signal line. The information of the names of these clock signal lines and level 1 is inputted from the keyboard 8. The processor 10 receives this data to form and store a signal level table 15 as shown in step 61 of FIG. 6. The information, level 2 may not be inputted since there are only two levels in this embodiment. Next, the logic data is read out from the magnetic disk device 1. When the name of the signal line coinciding with the signal line name 16 in the signal level table 15 is read out, the logic circuit devices connected with this signal line are classified according to the signal level 17. They are classified into a first group in this embodiment. On the other hand, the logic circuit devices connected with only the signal lines not registered in the signal level table 15 are classified into a second group. These devices belonging to the first group and second group are stored in areas 12 and 13, respectively as shown in step 62 of FIG. 6. The data of the classified logic circuit devices of the high level, i.e., the logic data of the first group is read out prior to that of the second group as shown in step 63. On the basis of the readout data, the arrangement of the logic circuit devices is made on the circuit board. This arrangement can be made in accordance with the conventional method of arrangement, e.g., the cluster method which is shown in the article entitled Algorithms for Backplane Formation in "Microelectronics in Large Systems" by J. M. Kurtzberg in pp. 51–76 of Spartan Books 1965 as shown in step 64. This result is shown in FIG. 4, in which the flip-flop devices 31 and 32 are arranged in proximity to each other and connected with each other through the clock signal line 33 which is connected with the external terminal 38. Thus, the arrangement is determined so as to shorten the length of wiring. Thereafter, it is determined whether the above processing is completed for all the signal levels or not as shown in step 65, and if not completed, the logic data of the next level is read out to accomplish the arrangement. FIG. 5 shows the arrangement on the logic data of the second group added with the arrangement result of FIG. 4. Thus, the entire arrangement of all the logic circuit devices is completed. Then, the total length $L_0$ of wiring is calculated taking the weighting into consideration as shown in step 66. Assuming that the length of each signal line is $l_1, l_2 \ldots l_n$; and that the weighting of the level 1 is 48 and that of the level 2 is 1, the total length is expressed as $$L_0 = 48\, l_1 + l_2 + l_3 + \ldots l_n \qquad (66)$$

If the weighting is more generally divided into three levels of FA, FB and FC, the total length expressed as $L_0 = FA\, l_1 + FA\, l_2 + FB\, l_3 + \ldots + FC\, l_n$ is calculated.

These logic circuit devices, the arrangement of which are once determined, are rearranged one by one. This can be performed by the Force-Directed Pairwise Relaxation method. The method is described in the article entitled Force Directed Pairwise Relaxation "A study of Placement Technique", by H. Hanan et al in Journal of Design Automation & Fault-Tolerant Computing, October 1976, Vol. 1 No. 1 as shown in step 67. The total length $L_n$ of wiring with the weighting considered is calculated as shown in step 68.

If this length of wiring is shorter than that based on the previous arrangement, this new arrangement is adopted. Then, the value of $L_n$ is substituted for $L_0$ so as to register the total length with the minimum weighting which has been previously calculated in accordance with 69, 70, 71, and 72.

This processing is repeated for all the combinations of the logic circuit devices, and accordingly the total length of wiring with the minimum weighting is determined. The improved arrangement shown in FIG. 5 provides the shortest length of wiring so that this initial arrangement is adopted as a final arrangement in accordance with step 73.

Thus, the arrangement of logic circuit devices can be made, for which arrangement the degrees of expediting signal propagation in each signal line are taken into consideration. Incidentally, in this embodiment, the processings of step 66 et seq. of FIG. 6 are performed in order to further shorten the total length of wiring, but the processings may be omitted as the case may be.

In the other embodiment of classifying logic circuit devices according to the levels thereof, the level information input from the key board 8 is added with the data representing the logic circuit devices in a logic data. Thereafter these logic circuit devices are classified by the sorting in accordance with the level information.

Although the present invention has been shown and described with reference to particular embodiment, various changes and modifications obvious to one skilled in the art to which the invention pertains are deemed to be within the spirit, scope, and contemplation of the invention.

What is claimed is:

1. A method of arranging logic circuit devices on a circuit board on the basis of a logic data defining the logic circuit devices and signal lines for connecting the logic circuit devices to each other comprising the steps of:
   (a) allotting to said signal lines, degrees of expediting signal propagation through the signal lines;
   (b) arranging the logic circuit devices connected with the signal line to which the highest degree is allotted, on the circuit board;
   (c) arranging the logic circuit devices connected with the signal line to which the second highest degree is allotted, on the circuit board; and
   (d) repeating the step (c) till the step (c) is completed for the logic circuit devices connected with the signal line to which the lowest degree is allotted.

2. A method of arranging logic circuit devices on a circuit board according to claim 1, wherein said step (b) comprises the steps of; classifying said logic circuit devices depending on the degrees of expediting signal propagation in the signal lines connected with the logic circuit devices; and taking out the logic circuit devices belonging to the group having the highest degree to arrange the logic circuit devices on the circuit board.

3. A method of arranging logic circuit devices on a circuit board according to claim 1, further comprising the step of setting different weighting values per unit signal line length to the signal lines having different signal propagation expediting degrees, and adjusting the arrangement of the logic circuit devices on the circuit board so that the total of the products of the length of each signal line and said weighting value therefor may become the minimum.

4. A method of arranging logic circuit devices on a circuit board according to claim 3, wherein the higher said expediting degree, the larger said weighting value.

* * * * *